(12) United States Patent
Justice et al.

(10) Patent No.: US 6,496,075 B2
(45) Date of Patent: Dec. 17, 2002

(54) AUTOMATIC TUNING OF VCO

(75) Inventors: Scott Justice, Durham, NC (US); Erik Bengtsson, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/808,264

(22) Filed: Mar. 14, 2001

(65) Prior Publication Data

US 2002/0167362 A1 Nov. 14, 2002

(51) Int. Cl.[7] .................................................. H03L 7/00
(52) U.S. Cl. .......................................... 331/11; 331/1 A
(58) Field of Search .............................. 331/11, 1 A, 17

(56) References Cited

U.S. PATENT DOCUMENTS

| | | | |
|---|---|---|---|
| 3,177,442 A | * 4/1965 | Halverson | 331/17 |
| 5,175,884 A | 12/1992 | Suarez | 455/260 |
| 5,648,744 A | 7/1997 | Prakash et al. | |
| 5,686,864 A | 11/1997 | Martin et al. | 331/1 A |
| 5,739,730 A | * 4/1998 | Rotzoll | 331/177 V |
| 5,942,949 A | 8/1999 | Wilson et al. | |

FOREIGN PATENT DOCUMENTS

| | | |
|---|---|---|
| EP | 0442461 A2 | 8/1991 |
| EP | 0944171 A1 | 9/1999 |
| GB | 2120478 A | 11/1983 |

OTHER PUBLICATIONS

Article called "Physical Processes of Phase Noise in Differential LC Oscillators." (4 pages) J. J. Rael et al.

* cited by examiner

Primary Examiner—Robert Pascal
Assistant Examiner—Joseph Chang
(74) Attorney, Agent, or Firm—Coats & Bennett, P.L.L.C.

(57) ABSTRACT

A voltage controlled oscillator (VCO) is tunable over a wide frequency range while exhibiting low phase noise by dynamically switching between two or more voltage/frequency operating curves. Reference voltages establish switching thresholds for each operating curve. A control circuit compares the VCO tuning voltage to the reference threshold voltages, and based on that comparison and its previous outputs, generates switching signals effective to selectively couple and decouple one or more frequency altering devices to the VCO.

21 Claims, 7 Drawing Sheets

US 6,496,075 B2

AUTOMATIC TUNING OF VCO

BACKGROUND OF THE INVENTION

The present invention relates generally to the field of voltage controlled oscillators, and specifically to a method of automatically tuning a voltage controlled oscillator over a wide frequency range.

Wireless radio communications systems transmit voice and other data between fixed transceivers and mobile radio communications terminals via the propagation of radio frequency (RF) electromagnetic waves. Essential to the functionality of such a wireless communication system is the stable and accurate generation of oscillating electrical signals. One circuit widely used to generate such oscillating signals is a phase-lock loop (PLL). A PLL is an electrical circuit that generates an oscillating output signal that has a constant phase relationship with an oscillating input signal. By utilizing a highly stable and accurate source, such as a crystal oscillator, to generate the oscillating input signal, and various frequency multipliers and dividers, a stable and accurate oscillating output signal can be generated across a range of frequencies.

A critical component of a typical PLL is a Voltage Controlled Oscillator (VCO). The VCO generates an oscillating signal at its output, the frequency of which is responsive to a voltage level applied at its input. In the PLL, the voltage input, referred to herein as the tuning voltage, is a function of the phase/frequency error between the output of the VCO and the desired oscillating signal. The VCO thus generates an oscillating signal at a frequency that varies over a finite range, corresponding to variations in the tuning voltage over a corresponding finite range. The specific parameters of this voltage/frequency relationship depend upon the design of the VCO, the values of electrical components that comprise the VCO, ambient temperature, and other effects as are widely known in the electronics arts. Ideally, if plotted on a voltage/frequency axis, the relationship would define a generally linear curve with positive slope, i.e., an increase or decrease in the tuning voltage causes a corresponding increase or decrease in the frequency of the oscillating signal generated by the VCO. Such a voltage/frequency curve is referred to herein as an operating curve of the VCO.

To expand the frequency range of a VCO, it is known to selectively couple frequency altering components, such as for example capacitors, varactors, FET transistors, and the like, to the resonant circuit in the VCO. This alters the range of frequencies generated in response to the tuning voltage, in effect establishing a new operating curve for the VCO. For example, it is known to couple various capacitors to a VCO via a programmable switching matrix such that, by selectively configuring the switches, a plurality of overlapping frequency ranges for the VCO may be selected. This ensures that the VCO may be calibrated to compensate for deviations in operating its frequency range due to manufacturing process variations or other parasitic effects, by choosing a VCO operating curve to encompass the desired range of VCO operation. This calibration, also known as VCO trimming, generally occurs in the factory upon manufacture of the integrated circuit containing the VCO, such as for example, by burning fuses or by programming a particular value in a register, the contents of which control the switches connecting the transistors to the VCO oscillator.

Factory tuning of a VCO to a particular operating curve is a time-consuming, and thus costly, part of the manufacturing process. Additionally, once thus tuned, the VCO is limited to a single, finite range of operation, as it is restricted to a single operating curve.

SUMMARY OF THE INVENTION

The present invention entails a self-tuning voltage controlled oscillator circuit. The VCO produces an oscillating signal at its output, the frequency of which is responsive to a tuning voltage its input. At least one frequency altering device is selectively coupled to the VCO and is operative to alter the relationship of the tuning voltage to the VCO output frequency, thereby establishing at least two operating curves describing the relationship of the VCO tuning voltage to the VCO output frequency. The VCO is switched between the operating curves by a control circuit. In one aspect of the invention, the control circuit monitors the tuning voltage and generates outputs operative to selectively couple the frequency altering device(s) to the VCO based only on the value of the tuning voltage. In another aspect, the control circuit receives a plurality of reference voltages establishing a plurality of switching thresholds and outputs switching signals based on a comparison of the VCO tuning voltage to the plurality of switching thresholds, and on its previous outputs.

DETAILED DESCRIPTION OF THE INVENTION

Figure 1:
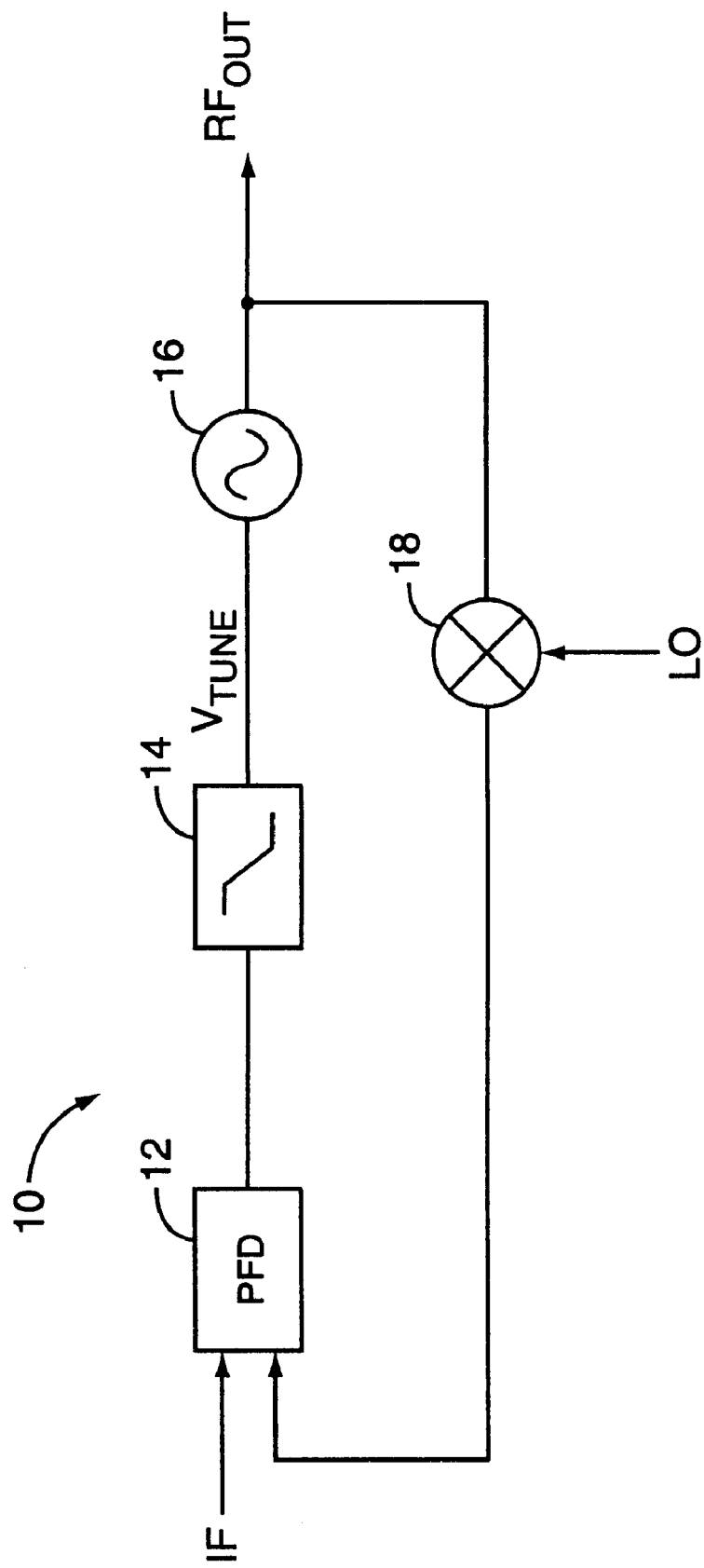
FIG. 1 is a functional block diagram of a prior art PLL.

FIG. 1 depicts a typical phase locked loop (PLL), a circuit well known in the art, indicated generally by the numeral 10. PLL 10 contains phase/frequency detector 12, low pass filter 14, voltage controlled oscillator (VCO) 16, and mixer 18. VCO 16 generates a radio frequency oscillating output signal, $RF_{OUT}$, in response to a tuning voltage $V_{TUNE}$. The RF output is combined with a signal from a local oscillator at mixer 18, generating an intermediate frequency signal, that is compared to a locally generated IF signal by the phase/frequency detector 12. The phase/frequency detector 12 generates an output signal whose voltage is dependent on the phase and/or frequency relationship between its two inputs. This signal is filtered by low-pass filter 14, generating the tuning voltage $V_{TUNE}$ used to drive the VCO 16.

The range of frequencies to which the PLL 10 of FIG. 1 can be tuned depends on the characteristics of VCO 16. One inherent trade-off in the design of voltage controlled oscillators is the interplay between tuning range and phase noise. As the frequency tuning range of VCO 16 is expanded, the PLL is more susceptible to phase noise, due to the limited resolution of $V_{TUNE}$. By restricting the tuning range of the VCO 16, phase noise is reduced, as fluctuations in the $V_{TUNE}$ voltage generate much narrower corresponding fluctuations in output frequency.

Figure 2:
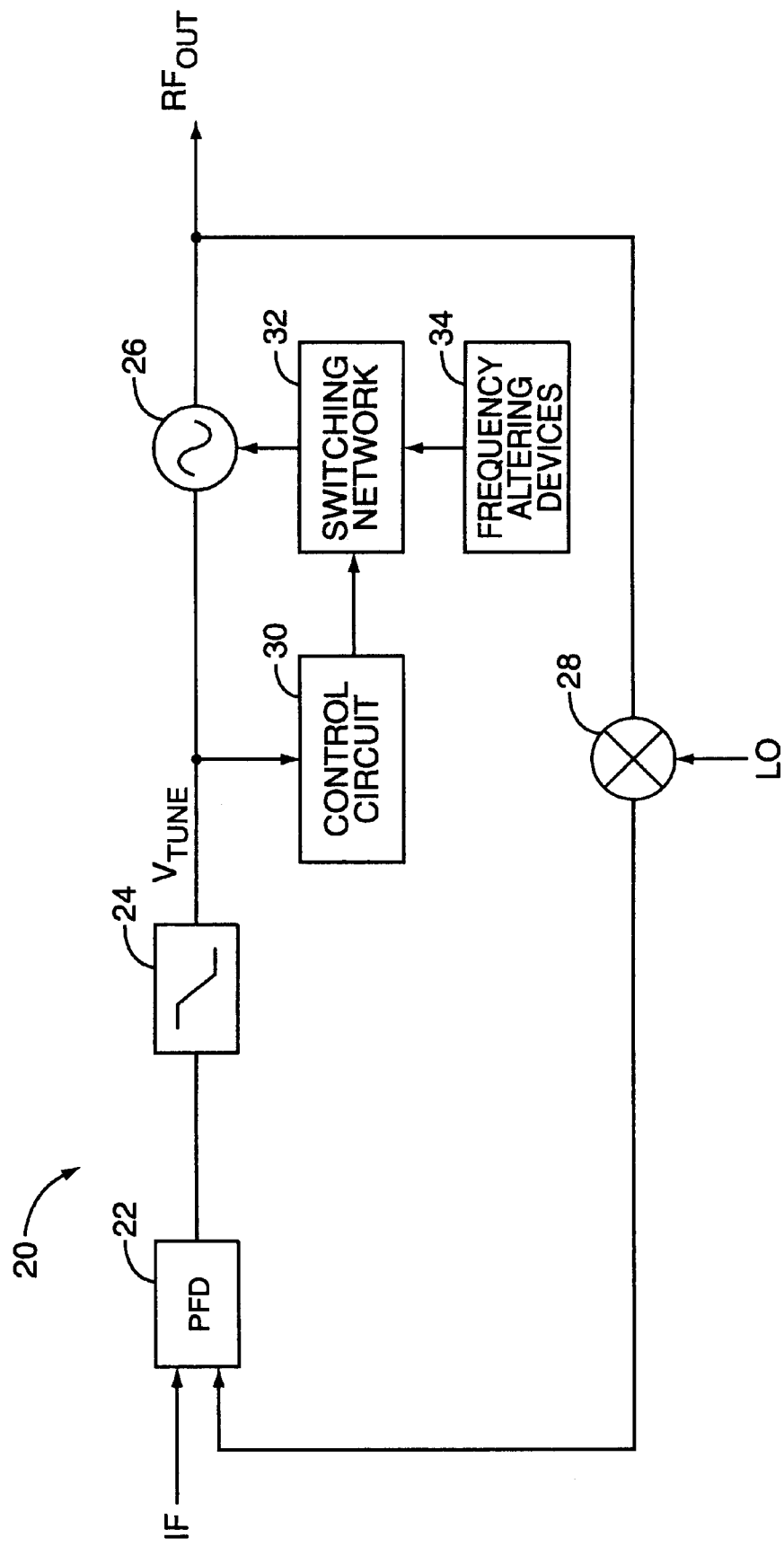
FIG. 2 is a functional block diagram of a PLL of the present invention.

According to the present invention, the tuning range of a VCO (and consequently of a PLL) is expanded without a concomitant increase in phase noise. This is accomplished by dynamically switching the VCO operating curve during operation of the PLL. FIG. 2 depicts a PLL according to the present invention, indicated generally by the numeral 20. PLL 20 contains a phase/frequency detector 22, low pass filter 24, VCO 26, and mixer 28, all corresponding in structure and function to the analogous components of the PLL 10 depicted in FIG. 1. Additionally, PLL 20 includes a control circuit 30, a switching network 32, and one or more frequency altering devices 34. The control circuit 30 monitors the tuning voltage $V_{TUNE}$, comparing it to a series of switching threshold voltages. When PLL 20 is seeking to lock to a higher or lower frequency than its current operation, control circuit 30 monitors the corresponding increase or decrease in $V_{TUNE}$ voltage. As the $V_{TUNE}$ voltage crosses an upper or lower threshold value, the control circuit drives the switching network 32 to connect or disconnect one or more frequency altering devices 34 to the resonant circuit of VCO 26. The frequency altering devices 34 may comprise capacitors, varactors, FET transistors, or the like. As one or more of these frequency altering devices 34 are selectively coupled or decoupled to the VCO 26 through the switching network 32, the voltage-to-frequency relationship, or "operating curve," of the VCO 26 is changed.

Figure 3:
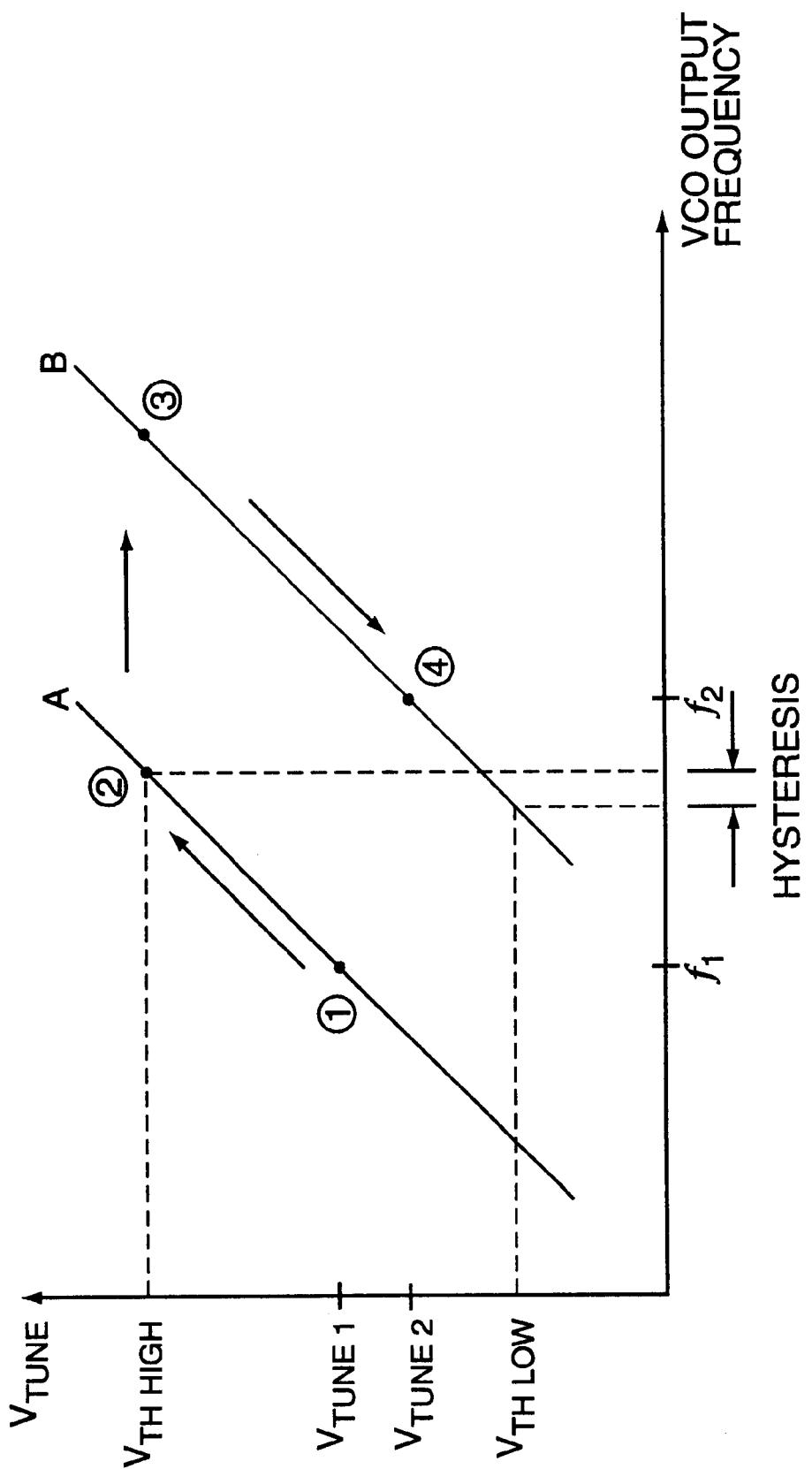
FIG. 3 is a graph depicting two VCO operating curves having a positive slope, according to one embodiment of the present invention.

The graph of FIG. 3 depicts the operation of a PLL 20 of the present invention, wherein two operating curves A and B are defined. The PLL 20 is initially locked to frequency $f_1$, with an input voltage $V_{TUNE1}$, as depicted by point 1 in FIG. 3. As the PLL 20 attempts to tune to frequency $f_2$ (for example, by altering the intermediate frequency supplied to the phase/frequency detector 22), $V_{TUNE}$ increases, causing the VCO 26 to generate a correspondingly higher frequency output. As $V_{TUNE}$ reaches the high switching threshold for operating curve A, indicated as $V_{TH\ HIGH}$, and indicated at point 2, the control circuit 30 causes the switching network 32 to couple or decouple one or more frequency altering devices 34 to the VCO 26. This switches operation of the VCO 26 to the higher frequency operating curve B. Since the tuning voltage $V_{TUNE}$ has not changed at this point, the VCO operates at point 3 on operating curve B, generating a higher than desired output frequency. Normal operation of the PLL 20 will subsequently decrease the value of $V_{TUNE}$ causing the VCO 26 to decrease its output frequency, traveling along operating curve B as indicated until the desired frequency $f_2$ is reached, as indicated at point 4.

If the PLL 20 later attempts to tune to a lower frequency, such as for example to $f_1$, a similar process will occur. The value of $V_{TUNE}$ will decrease, causing the operating point of VCO 26 to travel down operating curve B until the lower switching threshold voltage $V_{TH\ LOW}$ is reached. At this point, one or more frequency altering devices 34 will be coupled or decoupled from the VCO 26, placing the operation of the VCO 26 on operating curve A, well below the desired $f_1$. The normal operation of PLL 20 will then drive $V_{TUNE}$ higher, until the system locks at frequency $f_1$.

FIG. 3 also depicts the hysteresis built into the tunable VCO of the present invention. As used herein, "hysteresis" refers to the voltage/frequency relationship between the switching points on adjacent operating curves of the VCO 26, i.e., between the upper switching threshold of a lower frequency operating curve and the lower switching threshold of an adjacent higher frequency operating curve. As depicted in FIG. 3, the upper switching point of operating curve A should be set such that its frequency is higher than that of the lower switching point on operating curve B. This avoids oscillation between the two operating curves.

Figure 4:
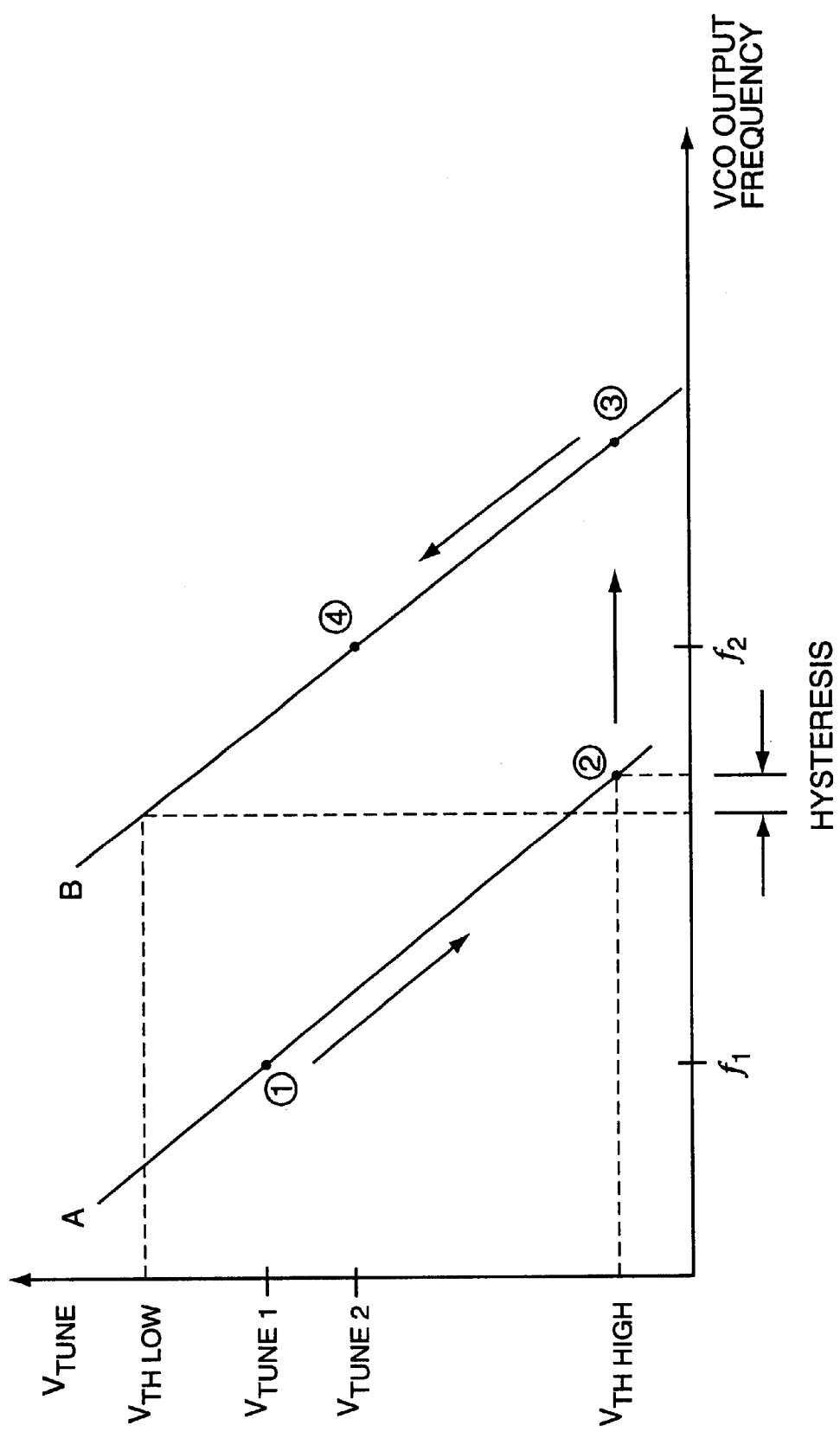
FIG. 4 is a graph depicting two VCO operating curves having a negative slope, according to one embodiment of the present invention.

It may be possible to construct a VCO with the opposite voltage/frequency relationship. This situation is depicted in FIG. 4, wherein voltage/frequency operating curves A and B have a negative slope. As the tuning voltage $V_{TUNE}$ decreases, the output frequency f increases. Operation of this tunable VCO in tuning from initial frequency $f_1$ to desired frequency $f_2$ is directly analogous to that described above. Initially, the VCO operates at point 1 on curve A, with a tuning voltage $V_{TUNE1}$ and output frequency $f_1$. The tuning voltage then decreases, increasing the output frequency, until the upper switching threshold $V_{TH\ HIGH}$ is reached (as used herein, the threshold denominators "upper," "lower," "high," and "low" refer to the associated output frequency, not the tuning voltage). Upon crossing $V_{TH\ HIGH}$, a frequency altering device is switched into the VCO oscillator circuit, switching operation to curve B, at point 3. Normal PLL operation will increase the tuning voltage $V_{TUNE}$, decreasing the output frequency until the VCO comes to rest at the desired output frequency $f_2$, with the tuning voltage at $V_{TUNE2}$, as depicted at point 4. FIG. 4 additionally demonstrates the hysteresis built into the operating curves A and B and the associated switching thresholds. In particular, the upper switching threshold of curve A, $V_{TH\ HIGH}$, is at a higher frequency than the lower switching threshold $V_{TH\ LOW}$ of curve B. As described above, this hysteresis prevents oscillation of the VCO between the two operating curves. The remainder of the present invention is disclosed herein with reference to the positive slope operating curves depicted in FIG. 3. However, one of ordinary skill in the art will readily recognize that analogous circuits and algorithms may be applied to a VCO with negative slope operating curves, as depicted in FIG. 4.

Figure 5:
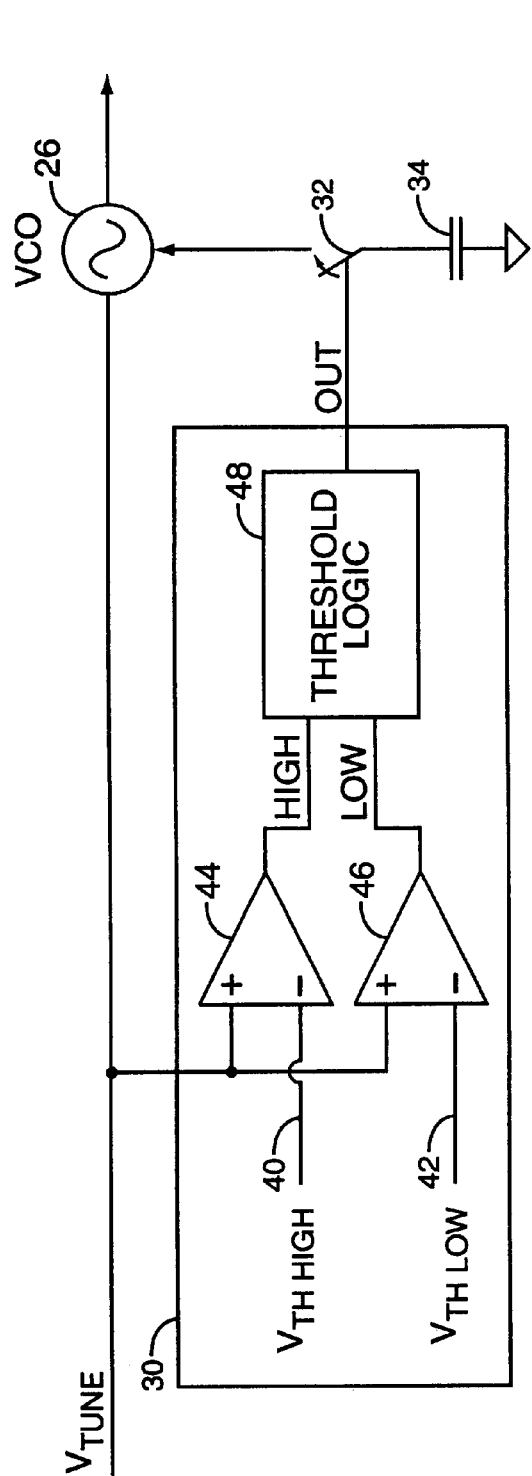
FIG. 5 is a block diagram depicting one exemplary control circuit of the embodiment of the present invention of FIG. 3.

FIG. 5 depicts one illustrative embodiment of the control circuit 30 of the PLL 20 depicted in FIG. 3, i.e., having two positive slope operating curves A and B for the VCO 26. In FIG. 5, the frequency altering device 34 is depicted schematically as a capacitor, and the switching network 32 is depicted schematically as a simple switch. Control circuit 30 generates or receives the upper switching threshold voltage 40 for operating curve A, and the lower switching threshold voltage 42 corresponding to operating curve B. The threshold voltages may be generated in a wide variety of ways, as are well known in the art. For example, the threshold voltages could be derived from a resistor voltage divider network. Alternatively, they may be generated by digital to analog converters, with the digital threshold values being set, for example, by blowing fuses, by writing digital values to registers, or by generating the values dynamically, such as from a microprocessor or digital signal processor. The switching threshold voltages are continuously compared to the tuning voltage $V_{TUNE}$ by comparators 44 and 46. When $V_{TUNE}$ crosses either threshold, a corresponding signal is sent from comparators 44 or 46 to the threshold logic 48, which drives the switching network 32.

The threshold logic 48, in addition to the voltage threshold crossing information generated by comparators 44 and 46, additionally monitors its own current switching signal output state. Thus, the threshold logic 48 contains some memory element, such as, for example, feedback in a logic circuit, a state-preserving circuit device such as a latch or flip-flop, or the like. The output of the threshold logic 48 is a function of its threshold inputs and its previous output state. This state-dependent logic is referred to herein as "state dependent threshold crossing logic."

Figure 5A:
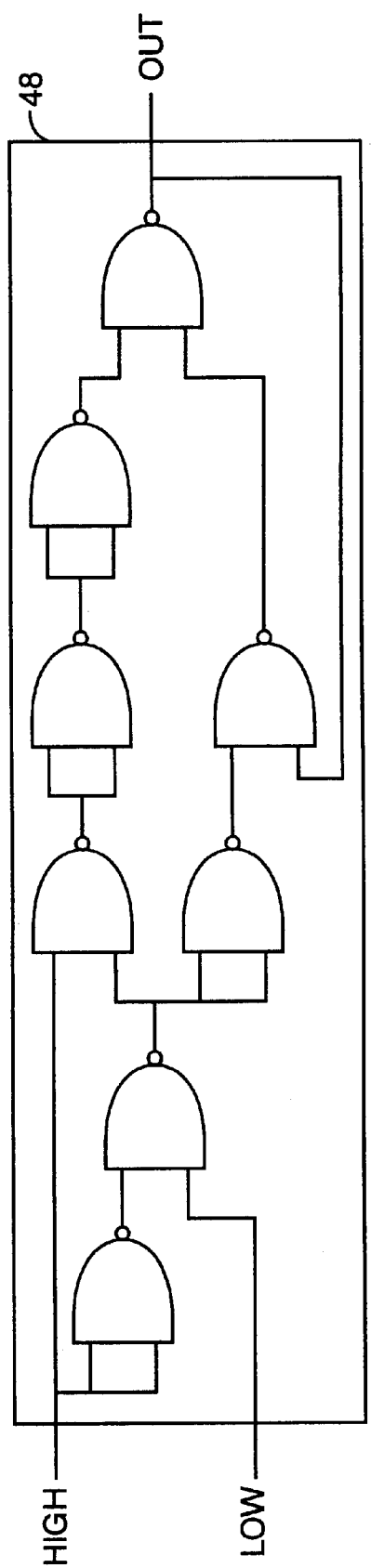
FIG. 5A is a schematic diagram of one implementation of the threshold logic of FIG. 5.

Table 1 depicts a truth table implementing state dependent threshold crossing logic for the threshold logic 48 of FIG. 5. When $V_{TUNE}$ is below the lower threshold voltage, the comparators 44 and 46 both output a low logic level, denoted by 0. When $V_{TUNE}$ equals or exceeds one of the thresholds, the associated comparator outputs a logical 1. Thus, a 1 at comparator 46 and a 0 at comparator 44 indicates operation between the two thresholds; and a 1 at both comparators indicates that $V_{TUNE}$ equals or has exceeded the high threshold. A logical 1 at the output of the threshold logic 48 closes switch 32, shifting the VCO 26 from operating curve A to operating curve B, as depicted in FIG. 3. The current output state of threshold logic 48 is denoted by $Q_n$, and the previous state by $Q_{n-1}$. A "DC" in Table 1 denotes a Don't-Care condition; the associated state may be a 1 or a 0. Note that between the lower and upper thresholds, i.e., during VCO 26 operation along either of the two curves A or B, the LOW threshold input is a 1 and the HIGH threshold input is a 0. An illustrative circuit implementing the state dependent threshold crossing logic of Table 1 is depicted in FIG. 5A.

TABLE 1

Truth Table for State Dependent Threshold Crossing Logic

| LOW | HIGH | $Q_{n-1}$ | $Q_n$ | Comment |
| --- | --- | --- | --- | --- |
| 1 | 0 | 0 | 0 | VCO on first operating curve |
| 1 | 1 | DC | 1 | Above upper threshold; switch VCO to second operating curve |
| 1 | 0 | 1 | 1 | VCO on second operating curve |
| 0 | 0 | DC | 0 | Below lower threshold; switch VCO to first operating curve |
| 0 | 1 | DC | DC | Not possible; included for complete truth table. |

Figure 6:
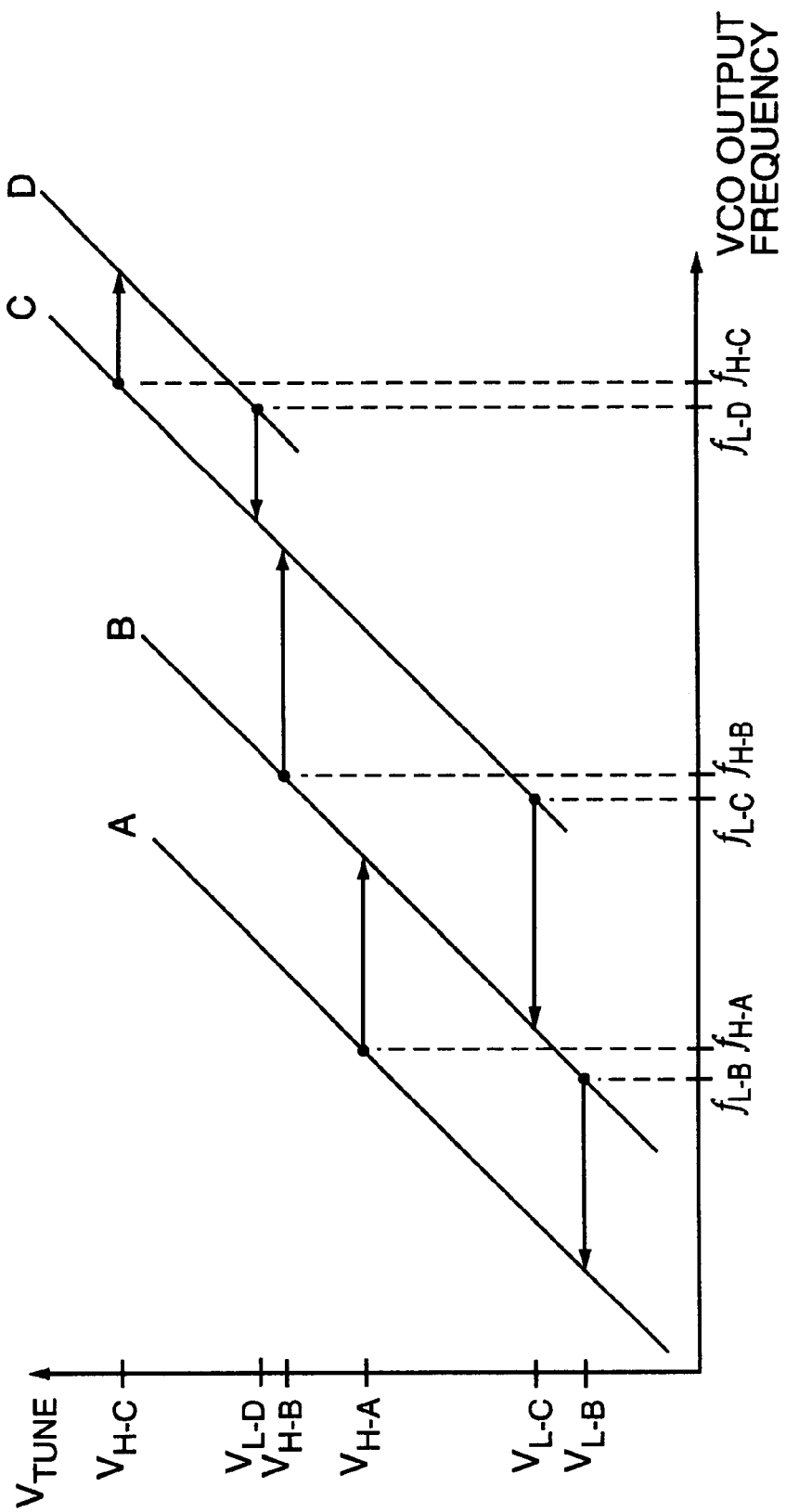
FIG. 6 is a graph depicting four VCO operating curves, according to another embodiment of the present invention.

The PLL 20, as described above, may readily be extended to encompass a plurality of operating curves, thus increasing the tuning range. FIG. 6 depicts the voltage/frequency relationship for a PLL 20 according to the present invention, wherein the VCO 26 has four distinct operating curves—A, B, C, and D. Each operating curve has associated with it at least one switching threshold —a high threshold that causes the VCO 26 to switch to a higher frequency operating curve, a low threshold that causes the VCO 26 to switch to a lower frequency operating curve, or both. Close inspection of this graph reveals several advantages and features of the relationship between the various switching thresholds.

First, it is noted that, in general, the switching thresholds may comprise any value within the range for $V_{TUNE}$ produced by the phase/frequency detector 22 and low-pass filter 24. That is, the switching thresholds are not limited to the upper and lower extent of the range of $V_{TUNE}$ voltages.

Second, each operating curve exhibits hysteresis, as described above. Specifically, the frequency of the high switching threshold of operating curve A, $f_{H-A}$, is higher than the frequency of the low switching threshold of operating curve B, $f_{L-B}$. Similarly, $f_{H-B} > f_{L-C}$ and $f_{H-C} > f_{L-D}$.

Finally, it is noted that the upper switching threshold for each successive operating curve, in order of increasing frequency, is at a higher voltage then the upper switching threshold for the operating curve preceding it. This arrangement allows for proper operation of the present invention. If, for example, the upper switching threshold of operating curve B, $V_{H2}$, were below the upper switching threshold of operating curve A, $V_{H-A}$, then after $V_{TUNE}$ reached $V_{H-A}$, causing the VCO 26 to switch to operating curve B, the normal operation of PLL 20 would decrease $V_{TUNE}$, causing VCO 26 to decrease the frequency of its output. However, once $V_{TUNE}$ reached $V_{H-B}$, the control circuit 30 could immediately switch the VCO 26 to operating curve C, moving the output of the VCO 26 further from its desired frequency. By restricting the upper switching threshold of each operating curve to a value greater than the preceding operating curve, proper operation of PLL 20 along each operating curve is assured. Similarly, the value for the lower switching threshold for each operating curve should advantageously be greater than the lower switching threshold for the preceding operating curve.

Note, however, that there is no restriction on the relationship between upper and lower switching thresholds for adjacent operating curves. Consider operating curve D in FIG. 6. Both the lower and upper switching thresholds exceed the value of the upper switching threshold of operating curve C.

Figure 7:
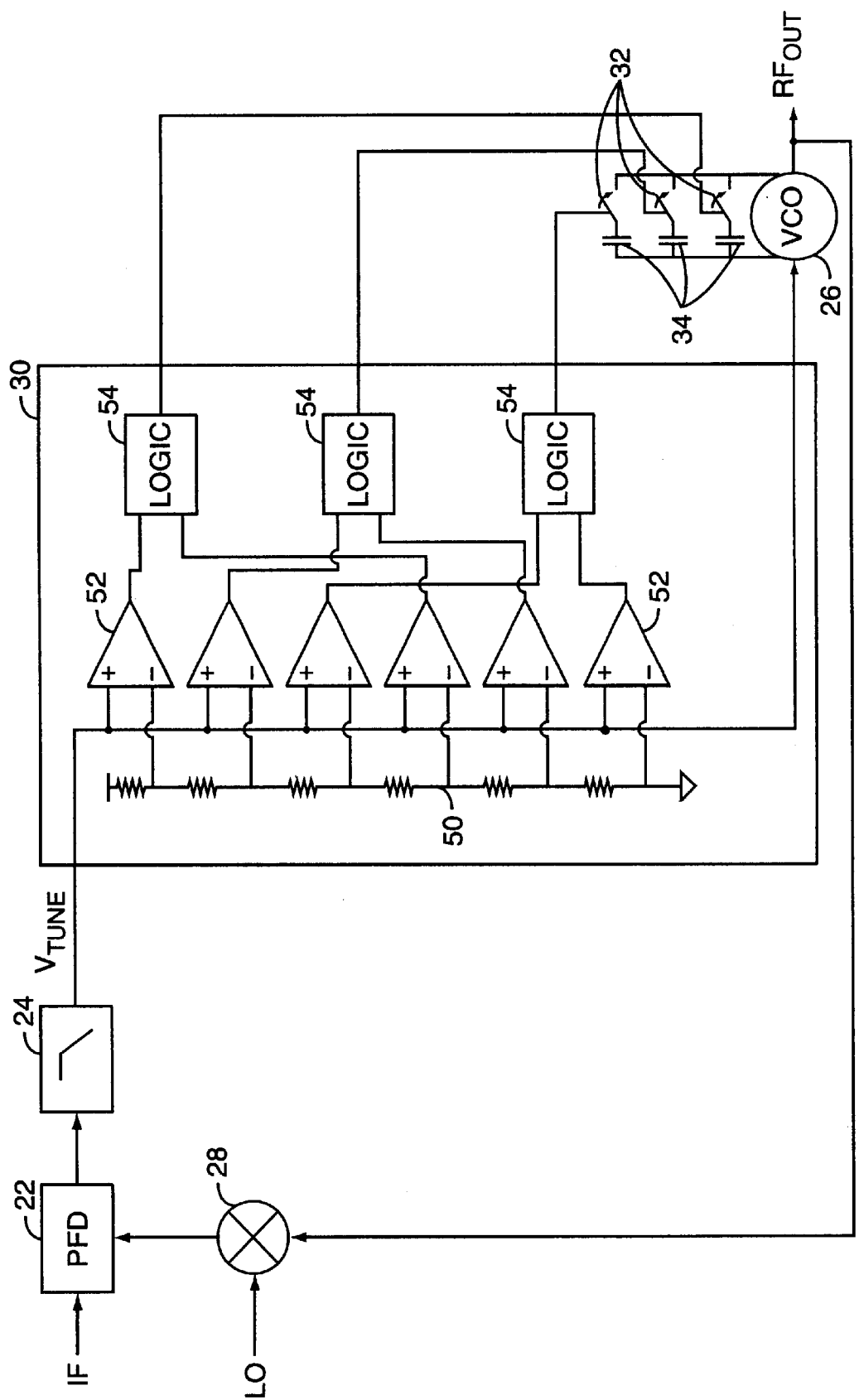
FIG. 7 is a block diagram depicting an exemplary control circuit of the embodiment of the present invention of FIG. 6.

FIG. 7 depicts an illustrative embodiment of the PLL 20 with four operating curves, as described above with reference to FIG. 5. PLL 20 contains a phase/frequency detector 22, low pass filter 24, VCO 26, and mixer 28, the functions of which have been previously described. Frequency altering devices 34 are depicted schematically as capacitors, and switching network 32 is depicted schematically as an array of switches. Control circuit 30 comprises a voltage divider network 50, comparators 52, and logic blocks 54. The resistive voltage divider network 50 produces switching threshold voltage values. Comparators 52 monitor $V_{TUNE}$, and compare its value to the relative switching threshold values. State dependent threshold crossing logic is contained in logic blocks 54. Each logic block 54 generates a switching signal output dependent upon the upper switching threshold for one operating curve, and the lower switching threshold for the next operating curve. The state dependent threshold crossing logic is analogous to that described above. Note that both the upper and lower switching thresholds for each successive operating curve are higher than those for previous operating curves, as discussed above.

In practice, the tunable VCO 26 of the present invention is effective to slew the radio frequency output $RF_{OUT}$ to a desired frequency within a large frequency range, with low phase noise. Since the loop bandwidth of the operating curve switching circuit is much greater than the corresponding loop bandwidth in, for example, the channel selection loop in a mobile radiocommunication terminal, the wide frequency deviations encountered when switching between VCO operating curves do not affect system performance. Once the PLL 20 locks onto a desired frequency, however, the VCO 26 generally has no need to switch its operation to a different operating curve. Indeed, this may result in undesired behavior, such as for example, passing drastic changes in output frequency to the mobile terminal transmitter during transmit mode. Hence, in practice the control circuit 30 of the present invention may be disabled when the PLL 20 is locked onto a desired frequency.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of operating a voltage controlled oscillator having an oscillating output responsive to an input tuning voltage, comprising:
   oscillating at a first frequency; and
   changing to a second frequency by:
      monitoring said tuning voltage;
      generating switching signals responsive only to said tuning voltage; and
      altering the operating curve of said voltage controlled oscillator by selectively coupling at least one frequency altering device to said voltage controlled oscillator in response to said switching signals.

2. The method of claim 1 wherein monitoring said tuning voltage comprises comparing said tuning voltage with at least one reference threshold voltage.

3. The method of claim 2 wherein said at least one reference threshold voltage may assume any value within the range of said tuning voltage.

4. The method of claim 3 wherein said at least one reference threshold voltage comprises two or more reference threshold voltages, and wherein said reference threshold voltages are selected to include hysteresis between operating curves.

5. The method of claim 1 wherein generating switching signals responsive to said tuning voltage comprises applying state dependent threshold crossing logic.

6. A method of operating a voltage controlled oscillator having an oscillating output responsive to an input tuning voltage, comprising:
   oscillating at a first frequency;
   switching to a second frequency by altering the operating curve of said voltage controlled oscillator by selectively coupling at least one frequency altering device to said voltage controlled oscillator, said alteration of said operating curve responsive to a comparison between said tuning voltage and a first reference threshold voltage; and
   switching to a third frequency by again altering said operating curve of said voltage controlled oscillator by selectively coupling said at least one frequency altering device to said voltage controlled oscillator, said alteration of said operating curve responsive to a comparison between said tuning voltage and a second reference threshold voltage, said second reference threshold voltage being distinct from said first reference threshold voltage.

7. The method of claim 6, wherein said first frequency and said third frequency are the same.

8. The method of claim 6, wherein said first frequency and said third frequency are different.

9. A self tuning voltage controlled oscillator circuit, comprising:
   a voltage controlled oscillator having first and second inputs and an output, said output producing an oscillating signal whose frequency is responsive to a tuning voltage applied to said first input;
   at least one frequency altering device selectively coupled to said second input and operative to alter the relationship of said tuning voltage to said frequency; and
   a control circuit having an input and at least one output, said input receiving said tuning voltage, and each of said at least one outputs operative to selectively couple at least one of said frequency altering devices to said voltage controlled oscillator, based only on said tuning voltage.

10. The circuit of claim 9, wherein said alteration of the relationship of said tuning voltage to said frequency by said at least one frequency altering device establishes a plurality of generally linear voltage/frequency operating curves, each said curve having a positive slope.

11. The circuit of claim 10, wherein said control circuit includes hysteresis between adjacent operating curves.

12. The circuit of claim 9, wherein said control circuit compares a plurality of reference voltages to said tuning voltage to establish upper and lower switching thresholds for switching the operation of said voltage controlled oscillator from one said operating curve to another.

13. The circuit of claim 12, wherein the upper switching threshold for each successive operating curve is higher than the upper switching threshold for any previous operating curve.

14. The circuit of claim 12, wherein the lower switching threshold for each successive operating curve is higher than the lower switching threshold for any previous operating curve.

15. The circuit of claim 12, wherein said control circuit additionally includes a memory element retaining the previous value of said control circuit output.

16. The circuit of claim 15, wherein said control circuit additionally includes state dependent threshold crossing logic.

17. The circuit of claim 9, wherein said alteration of the relationship of said tuning voltage to said frequency by said at least one frequency altering device establishes a plurality of generally linear voltage/frequency operating curves, each said curve having a negative slope, and wherein said control circuit compares a plurality of reference voltages to said tuning voltage to establish upper and lower switching thresholds for switching the operation of said voltage controlled oscillator from one said operating curve to another.

18. The circuit of claim 17, wherein the upper switching threshold for each successive operating curve is lower than the upper switching threshold for any previous operating curve, and wherein the lower switching threshold for each successive operating curve is lower than the lower switching threshold for any previous operating curve, and wherein for two adjacent operating curves, the lower switching threshold for the higher frequency curve switches at a lower frequency than does the upper switching threshold for the lower frequency operating curve.

19. A self turning voltage controlled oscillator circuit, comprising:
   a voltage controlled oscillator having first and second inputs and an output, said output producing an oscillating signal whose frequency is responsive to a turning voltage applied to said first input;
   at least one frequency altering device selectively coupled to said second input and operative to alter the relationship of said tuning voltage to said frequency, thereby establishing at least two operating curves; and
   a control circuit comparing a plurality of distinct reference voltages to said tuning voltage to establish switching thresholds for switching the operation of said voltage controlled oscillator from one said operating curve to another such that each successive operating curve covers a range of frequencies at least partially higher than the previous curve, by selectively coupling at least one of said frequency altering devices to said voltage controlled oscillator.

20. The circuit of claim 19, wherein said plurality of reference voltages comprises at least three distinct reference voltages.

21. The circuit of claim 19 wherein said control circuit compares a second plurality of distinct reference voltages to said tuning voltage to establish switching thresholds for switching the operation of said voltage controlled oscillator from one said operating curve to another, such that each successive operating curve covers a range of frequencies at least partially lower than the previous operating curve, by selectively coupling at least one of said frequency altering devices to said voltage controlled oscillator.

* * * * *

UNITED STATES PATENT AND TRADEMARK OFFICE
CERTIFICATE OF CORRECTION

PATENT NO.    : 6,496,075 B2
DATED         : December 17, 2002
INVENTOR(S)   : Scott Justice and Erik Lennart Bengtsson It is certified that error appears in the above-identified patent and that said Letters Patent is hereby corrected as shown below:

<u>Title page,</u>
Item [75], the middle name of the second inventor, "Lennart," should be added to make his full name -- Erik Lennart Bengtsson --.

Erik Lennart Bengtsson's city and state of "Cary, NC" should be changed to the city and country of -- Lund, Sweden --.

Signed and Sealed this

Twenty-second Day of April, 2003

JAMES E. ROGAN
*Director of the United States Patent and Trademark Office*